United States Patent

Yoshida

[11] 4,266,149
[45] May 5, 1981

[54] PULSE SIGNAL AMPLIFIER

[75] Inventor: Tadao Yoshida, Tokyo, Japan

[73] Assignee: Sony Corporation, Tokyo, Japan

[21] Appl. No.: 7,218

[22] Filed: Jan. 29, 1979

[30] Foreign Application Priority Data

Jan. 31, 1978 [JP] Japan .................................. 53-9457

[51] Int. Cl.³ ........................ H03K 3/01; H03K 17/60
[52] U.S. Cl. .................................. 307/255; 307/270;
307/297; 307/496
[58] Field of Search ............... 307/270, 255, 230, 297,
307/233, 106–108; 330/262, 263, 264

[56] References Cited

U.S. PATENT DOCUMENTS

| 3,127,522 | 3/1964 | Thorndyke ........................... 307/314 |
| 3,974,455 | 8/1976 | Kamimura et al. .................. 330/264 |
| 4,045,719 | 8/1977 | Salzer .................................... 307/108 |
| 4,128,813 | 1/1978 | Suzuki et al. ........................ 330/264 |

Primary Examiner—Stanley D. Miller, Jr.
Assistant Examiner—B. P. Davis
Attorney, Agent, or Firm—Hill, Van Santen, Steadman, Chiara & Simpson

[57] ABSTRACT

A pulse signal amplifier is disclosed which includes at least an emitter follower type drive stage consisting of a pair of complementary transistors and a field effect transistor connected to the drive stage and ON/OFF controlled thereby. A capacitive element is connected between the collectors of the complementary transistors and a pulse current signal source is provided to supply a charge current to the capacitive element and a drive current to the complementary transistors.

10 Claims, 4 Drawing Figures

PULSE SIGNAL AMPLIFIER

BACKGROUND OF THE INVENTION

1. Field of the Invention

The present invention relates generally to a pulse signal amplifier, and is directed more particularly to a pulse signal amplifier in which a power supply circuit for a drive stage is simplified.

2. Description of the Prior Art

In a prior art pulse signal amplifier having an FET (field effect transistor) as the final stage amplifying element, in order to drive the FET at a high speed there is provided a drive circuit which consists of a pair of complementary transistors connected in an emitter-follower configuration. In this case, a power supply circuit for the drive circuit is provided separately from a power supply circuit to the final stage amplifying element so as to avoid that the fluctuation in the power supply source at the final stage affects on the drive stage.

However, when the power supply circuits are provided separately for the final stage and the drive stage as in the prior art, the circuit construction becomes complicated and the circuit becomes expensive.

OBJECTS AND SUMMARY OF THE INVENTION

Accordingly, it is an object of the present invention to provide a pulse signal amplifier free from the defect inherent to the prior art.

It is another object of the invention to provide a pulse signal amplifier in which a part of a pulse current signal driving a driving circuit is charged in a capacitor and the voltage thereacross is used as a DC voltage source for the drive stage.

In accordance with an aspect of the present invention, a pulse signal amplifier is provided, which includes a pulse current signal source, an impedance transfer circuit consisting of first and second transistors each having first, second and third electrodes, the first electrodes of which are connected to each other and supplied with the output of the pulse current signal source and the second electrodes of which are connected to each other, a field effect transistor having gate, source and drain electrodes, the gate electrode of which is connected to the connection point of the second electrodes of said first and second transistors, the drain and source electrodes of which are connected between a DC voltage source and a reference point through a load, the pulse signal amplifier being characterized by a capacitive element having a pair of first and second terminals, the first terminal of which is connected to the third electrode of the first transistor and the second electrode of which is connected to the third electrode of the second transistor and to the reference point, and a switching element connected between the output of the pulse current signal source and the third electrode of the first transistor so as to carry a part of the output current of the pulse current signal source to the capacitive element to charge the same when the gate current of the field effect transistor is not supplied through the third and second electrodes of the first transistor.

The other objects, features and advantages of the present invention will become apparent from the following description taken in conjunction with the accompanying drawings through which the like reference numerals and letters designate the same elements.

DESCRIPTION OF THE PREFERRED EMBODIMENTS

Figure 1:
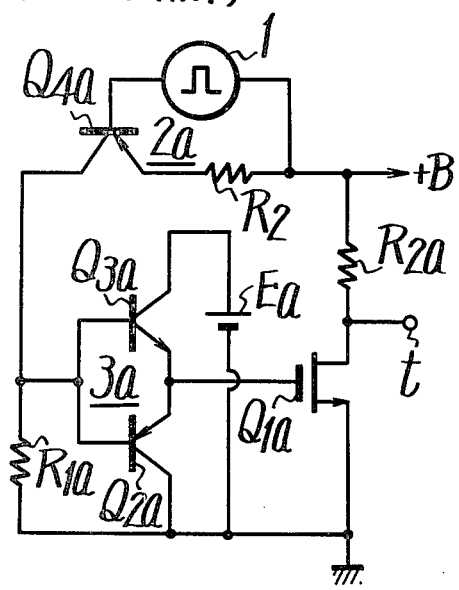
FIG. 1 is a circuit diagram showing a prior art pulse signal amplifier.

In order to better understand the present invention, a prior art pulse signal amplifier will be described firstly with reference to FIG. 1. In this prior art amplifier by way of example, there is provided an insulating gate type field effect transistor $Q_{1a}$ (in this example, an N-channel enhancement type MOS FET (field effect transistor) which forms an amplifier of a common source circuit type. A source of the transistor $Q_{1a}$ is grounded and its drain is connected to a voltage source $+B$ through a load register $R_{2a}$ and to an output terminal t.

There is also provided an impedance transfer circuit $3a$ consisting of transistors. In this case, the impedance transfer circuit $3a$ is formed of an emitter-follower configulation type complementary push-pull circuit using bi-polar transistors $Q_{2a}$ (PNP-type) and $Q_{3a}$ (NPN-type). In this case, in place of the bi-polar transistor an FET can be used. This impedance transfer circuit $3a$ is supplied with an operating voltage from a DC voltage source $E_a$. In detail, the collector of the transistor $Q_{3a}$ is connected to the positive terminal of the voltage source $E_a$ which is grounded at its negative terminal. The emitter of the transistor $Q_{3a}$ is connected to the emitter of the transistor $Q_{2a}$ whose collector is grounded. The output side of the impedance transfer circuit $3a$ i.e. connection point between the emitters of the transistors $Q_{2a}$ and $Q_{3a}$ is connected to the gate of the transistor $Q_{1a}$.

There is further provided a pulse current signal source $2a$ formed of PNP-type bi-polar transistor $Q_{4a}$ whose emitter is connected through a resistor $R_2$ to the voltage source $+B$ and of a pulse source 1 which is connected at its one end to the base of the transistor $Q_{4a}$ and at its other end to the voltage source $+B$. The collector of the transistor $Q_{4a}$ in the pulse current signal source $2a$ is grounded through a resistor $R_{1a}$ and also commonly connected to the bases of the transistors $Q_{2a}$ and $Q_{3a}$ in the impedance transfer circuit $3a$.

In the above prior art pulse signal amplifier, the DC voltage source $E_a$, which supplies the DC voltage to the impedance transfer circuit $3a$ as the operating voltage, is separate from the voltage source $+B$ for the transistor $Q_{1a}$, so that this prior art pulse signal amplifier is complicated in circuit construction and hence expensive.

Now, the present invention free from the defect of the prior art will be hereinafter described with reference to the attached drawings.

An example of the pulse signal amplifier according to the present invention will be described with reference to FIG. 2 in which the reference numerals corresponding to those used in FIG. 1 designate the same elements, respectively, and their detailed description will be omitted.

Figure 2:
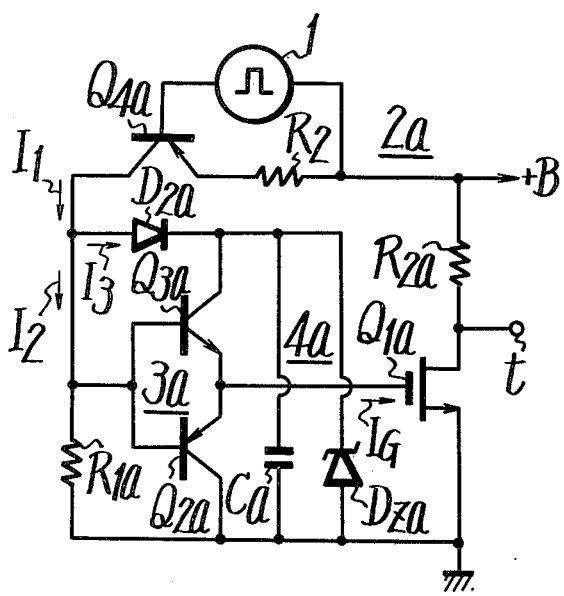
FIG. 2 is a circuit diagram showing an example of the pulse signal amplifier according to the present invention.

In the example of the invention shown in FIG. 2, a voltage source circuit 4a, which is a parallel circuit consisting of a capacitor $C_a$ (for example, having the capacity of 10 $\mu$F) and a Zener diode $D_{za}$ as a constant voltage element, is connected to the pulse current signal souce 2a in the pulse signal amplifier in place of the voltage source $E_a$ used in the piror art, and the output from the voltage source circuit 4a is applied to the impedance transfer circuit 3a as the operating voltage. That is, the collector of the transistor $Q_{3a}$ is grounded through the capacitor $C_a$ and connected to the cathode of the Zener diode $D_{za}$ whose anode is in turn grounded. The collector of the transistor $Q_{3a}$ is also connected to that of the transistor $Q_{4a}$ through a diode $D_{2a}$.

Figure 3A:
FIGS. 3A to 3D are waveform diagrams used for explaining an operation of the pulse signal amplifier of the invention shown in FIG. 2.
Figure 3B:
Figure 3C:
Figure 3D:
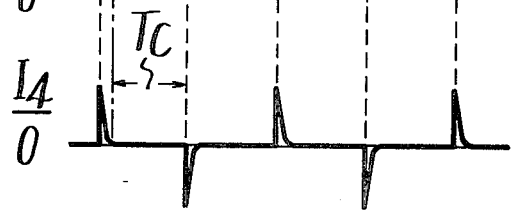

An operation of the pulse signal amplifier of the invention shown in FIG. 2 will be described with reference to the waveforms illustrated in FIGS. 3A to 3D. A pulse current or rectangular current $I_1$, which is developed from the pulse current signal source 2a and has the waveform shown in FIG. 3A and the frequency of, for example, 500 KHz, is divided into a current $I_2$, which flows to the resistor $R_{1a}$ and to the bases of the transistors $Q_{2a}$ and $Q_{3a}$ and whose waveform is shown in FIG. 3B, and into a current $I_3$, which flows through the diode $D_{2a}$ to the voltage source circuit 4a mainly and whose waveform is shown in FIG. 3C. A current $I_G$ flowing to the gate G of the transistor $Q_{1a}$ has such a waveform as just formed by differentiating the rectangular current $I_1$ shown in FIG. 3A, as illustrated in FIG. 3D. This is caused by the input capacities (of for example, about 1000 pF) existing between the gate and drain and between the gate and source of the transistor $Q_{1a}$. Since the current $I_G$ has the above waveform, the waveforms of the current $I_2$ and $I_3$ are not rectangular as that of the current $I_1$ but of waveforms such as shown in FIGS. 3B and 3C, respectively. The value of the current $I_2$ at its flat portion is expressed by $(V_x+V_d)/R_{1a}$ if it is assumed that the DC voltage of the voltage source circuit 4a is taken as $V_x$, the forward voltage drop of the diode $D_{2a}$ is taken as $V_d$, and the resistance of the resistor $R_{1a}$ is taken as $R_{1a}$, respectively.

Therefore, when the transistor $Q_{4a}$ is in ON-state and the transistor $Q_{3a}$ is in OFF-state or period $T_c$ in FIG. 3D, the capacitor $C_a$ is charged by the current $I_3$ ($=I_1-I_2$). The voltage across the capacitor $C_a$ can be used as the voltage source of the impedance transfer circuit 3a. In this case, if the mean value of a partial current of the current $I_3$, which is used to charge the capacitor $C_a$, is selected greater than the mean value of the positive portion of the current $I_G$, the potential at the collector of the transistor $Q_{3a}$ can be kept substantially constant. In the example of the invention shown in FIG. 2, the Zener diode $D_{za}$ is provided so as to prevent the voltage across the capacitor $C_a$ from being increased unnecessarily.

Thus, the field effect transistor $Q_{1a}$ is turned ON and OFF in response to the polarity of the pulse source 1 of the pulse current signal source 2a, and an amplified output pulse is delivered to the output terminal t.

In the example of the invention shown in FIG. 2, the enhancement type MOS FET is used as the FET $Q_{1a}$, but in place thereof a depression type MOS FET or triode characteristic FET can be used.

Another example of the invention will be now described with reference to FIG. 4, in which the parts or elements corresponding to those in FIG. 2 are marked with the same reference numerals and letters and their detailed description will be omitted.

Figure 4:
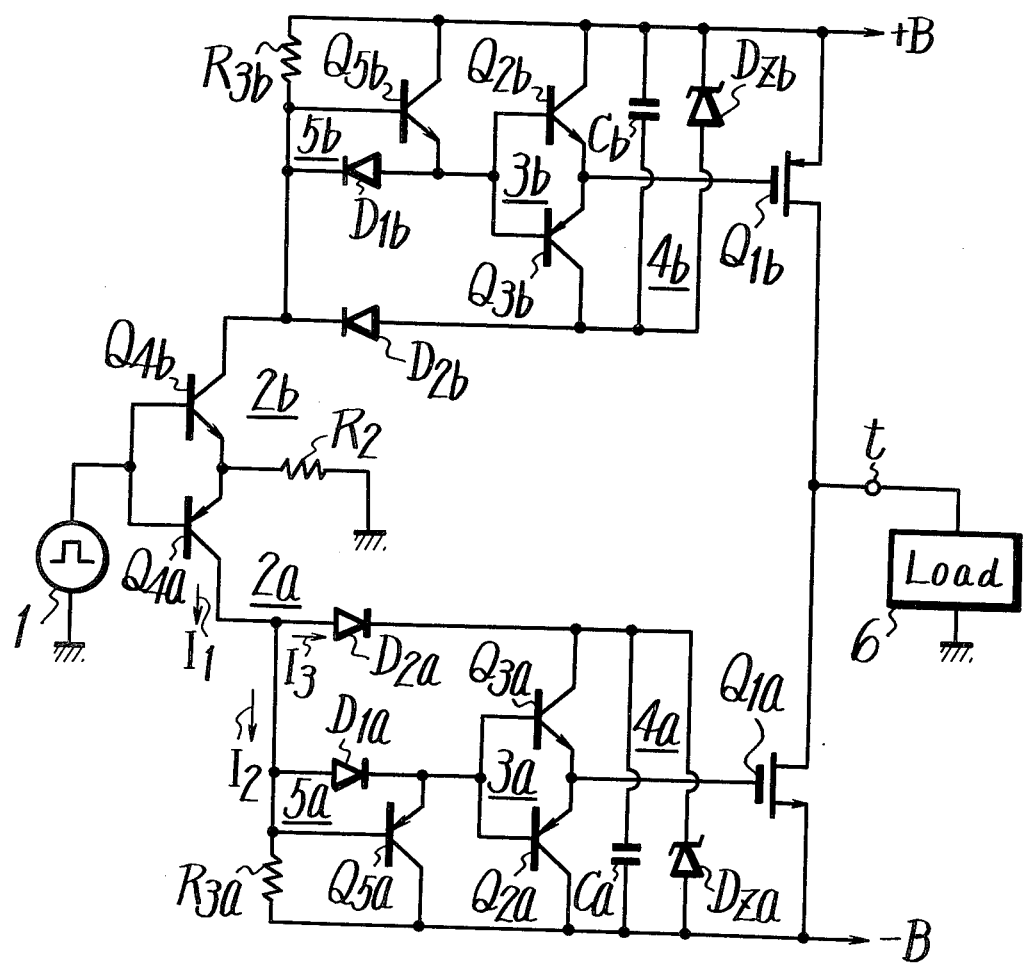
FIG. 4 is a circuit diagram showing another example of the invention.

The example of the invention shown in FIG. 4 is the case where the present invention is applied to a complementary push-pull type MOS FET pulse signal amplifier so that two amplifier circuits each being substantially same as that shown in FIG. 2 are used. In this case, a PWM (pulse width modulated) signal source is used as the pulse signal source.

In FIG. 4, transistors $Q_{1a}$ and $Q_{1b}$ are respectively insulating gate typefield effect transistors of an N-channel and a P-channel types (in the illustrated example, enhancement type MOS FETs) and the MOS FETs are each connected in a common source configuration circuit. That is, the sources of the respective transistors $Q_{1a}$ and $Q_{1b}$ are connected to the voltage sources $-B$ and $+B$ and the drains thereof are connected together to the output terminal t to which a load 6 is connected.

The impedance transfer circuit 3a and the voltage source circuit 4a for the transistor $Q_{1a}$ are formed similar to those of FIG. 2. In this case, in place of the resistor $R_{1a}$ used in FIG. 2, an SRPP (shunt regulated push-pull) circuit 5a is provided as an active load which will be described later. That is, the SRPP circuit 5a is formed of a PNP-type bi-polar transistor $Q_{5a}$, a diode $D_{1a}$ connected between the base and emitter of the transistor $Q_{5a}$ and a resistor $R_{3a}$ connected between the base and collector of the transistor $Q_{5a}$. The base of the transistor $Q_{5a}$ is further connected to the collector of the transistor $Q_{4a}$, the collector of the transistor $Q_{5a}$ is connected to the voltage source $-B$ and the emitter thereof is connected to the commonly connected bases of the transistors $Q_{2a}$ and $Q_{3a}$, respectively.

Since the pulse current signal source, the impedance transfer circuit, the voltage source circuit and the SRPP circuit for the other transistor $Q_{1b}$ are substantially same as those for the transistor $Q_{1a}$, they are marked with the corresponding reference with the suffix b in place of a and their detailed description will be omitted. In this case, the conductivity and the connection polarity of the transistors and the connection polarity of the diodes in the two amplifier circuits are selected opposite. The pulse source 1 (which is such a pulse source, whose pulse width is to be modulated and which has the carrier frequency of, for example, 500 KHz) is connected between the commonly connected bases of the transistors $Q_{4a}$ and $Q_{4b}$ and the ground.

In the example of FIG. 4, it is possible that, at the base side of the transistors $Q_{3a}$ and $Q_{2a}$ and similarly at the base side of the transistors $Q_{3b}$ and $Q_{2b}$, there is additionally provided a diode in the same direction as the diode $D_{1a}$ and diode $D_{1b}$, respectively.

Next, an operation of the example of the invention shown in FIG. 4 will be now described. During the negative half cycle of the pulse source 1, the transistor $Q_{4a}$ turns ON and hence the current $I_1$ flows out from the collector of the transistor $Q_{4a}$. This current $I_1$ is divided into the current $I_3$ to the diode $D_{2a}$ and the current $I_2$ to the resistor $R_{3a}$ as set forth above. A part of the current $I_2$ flows through the diode $D_{1a}$ to the base of the transistor $Q_{3a}$ in the impedance transfer circuit 3a, so that the transistor $Q_{3a}$ becomes ON. When the diode $D_{1a}$ becomes ON, the base-emitter of the transistor $Q_{5a}$, which forms the SRPP circuit 5a together with the diode $D_{1a}$ and the resistor $R_{3a}$, is reverse-biased and hence the transistor $Q_{5a}$ turns OFF. Due to the conduction of the transistor $Q_{3a}$, the input capacity of the FET $Q_{1a}$ is charged by the current $I_G$ (its positive portion) shown in FIG. 3D and then the FET $Q_{1a}$ turns ON. Thus, at the output terminal t there is developed the voltage $-B$. In this case, during the interval $T_c$ shown in FIG. 3D, the capacitor $C_a$ is charged by the current $I_3$, and accordingly it serves as the voltage source for the impedance transfer circuit $3a$.

When the transistor $Q_{4a}$ is in OFF-state, the base-emitter of the transistor $Q_{5a}$ is biased in the forward direction and hence the transistor $Q_{5a}$ turns ON (diode $D_{1a}$ turns OFF). Thus, at this time the transistor $Q_{2a}$ is made ON, so that the input capacity of the FET $Q_{1a}$ is discharged and hence the FET $Q_{1a}$ becomes OFF.

During the positive half cycle of the pulse source 1, the similar operation to that described above is carried out by the other amplifier circuit and hence the other FET $Q_{1b}$ turns ON with the result that at the output terminal t there is developed the voltage $+B$.

According to the present invention, the output side of the impedance transfer circuit, which consists of transistors, is connected to the gate of the insulating gate type FET, which forms the common source configuration type amplifier, and the pulse current signal source is connected to the input side of the impedance transfer circuit. Thus, in the invention there is no need to provide a separate voltage source to the impedance transfer circuit from the FET. As a result, the pulse signal amplifier of the present invention is simple in circuit construction and inexpensive.

It will be apparent that many modifications and variations could be effected by one skilled in the art without departing from the spirits or scope of the novel concepts of the present invention so that the spirits or scope of the invention should be determined by the appended claims only.

I claim as my invention:

1. A pulse signal amplifier comprising pulse current signal source; an impedance transfer circuit consisting of first and second transistors each having first, second and third electrodes, the first electrodes of which are connected to each other and supplied with the output of said pulse current signal source and second electrodes of which are connected to each other; a field effect transistor having gate, source and drain electrodes, the gate electrode of which is connected to the connection point of the second electrodes of said first and second transistors, the drain and source electrodes of which are connected between a DC voltage source and a reference point through a load, said pulse signal amplifier is characterized by:
  (a) a capacitor having a pair of first and second terminals, the first terminal of which is connected to the third electrode of said first transistor and the second terminal of which is connected to the third electrode of said second transistor and to said reference point; and
  (b) a diode connected between the output of said pulse current signal source and the third electrode of said first transistor so as to carry a part of the output current of said pulse current signal source to said capacitor to charge the same when the gate current of said field effect transistor is not supplied through the third and second electrodes of said first transistor.

2. A pulse signal amplifier according to claim 1, further including constant voltage means having first and second terminals connected across said capacitor.

3. A pulse signal amplifier according to claim 2, in which said first and second transistors are of an NPN conductive type and of a PNP conductive type, respectively, the first and second transistors being connected in common collector configuration and said field effect transistor comprises an N-channel enhancement type MOS field effect transistor connected in common source configulation.

4. A pulse signal amplifier according to claim 3, in which said pulse current signal source comprises a third transistor having base, emitter and collector electrodes, the collector electrode of which is used for the output of said pulse current signal source and the base-emitter circuit of which is supplied with a pulse signal to be amplified so as to ON/OFF control the same.

5. A pulse signal amplifier comprising a pulse current signal source; a first impedance transfer circuit consisting of first and second transistors each having first, second and third electrodes, the first electrodes of which are connected to each other and supplied with the output of said pulse current signal source and second electrodes of which are connected to each other; a first field effect transistor having gate, source and drain electrodes, the gate electrode of which is connected to the connection point of the second electrodes of said first and second transistors, the drain and source electrodes of which are connected between a first DC voltage source and a reference point through a load; a second impedance transfer circuit consisting of third and fourth transistors each having first, second and third electrodes, the first electrodes of which are connected to each other and supplied with the output of said pulse current signal source and second electrodes of which are connected to each other; a second field effect transistor having gate, source and drain electrodes the gate electrode of which is connected to the connection point of the second electrodes of said third and fourth transistors, and the drain and source electrodes of which are connected between a second DC voltage source and said reference point through said load, said pulse signal amplifier is characterized by:
  (a) a first capacitor having a pair of first and second terminals, the first terminal of which is connected to the third electrode of said first transistor and the second terminal of which is connected to the third electrode of said second transistor and said first DC voltage source;
  (b) a first diode connected between the output of said pulse current signal source and the third electrode of said first transistor so as to carry a part of the output current of said pulse current signal source to said first capacitor to charge the same when the gate current of said first field effect transistor is not supplied through the third and second electrodes of said first transistor;
  (c) a second capacitor having a pair of first and second terminals, the first terminal of which is connected to the third electrode of said third transistor and to said second DC voltage source and the second terminal of which is connected to the third electrode of said fourth transistor; and
  (d) a second diode connected between the output of said pulse current signal source and the third electrode of said fourth transistor so as to carry a part of the output current of said pulse current signal source to said second capacitor to charge the same when the gate current of said second field effect transistor is not supplied through the third and second electrodes of said fourth transistor.

6. A pulse signal amplifier according to claim 5, further including
   (a) first constant voltage means having a pair of terminals connected across said first capacitor means; and
   (b) second constant voltage means having a pair of terminals connected across said second capacitor means.

7. A pulse signal amplifier according to claim 6, in which said first and second transistors are of an NPN conductive type and of a PNP conductive type, respectively, the first and second transistors being connected in common collector configuration, respectively and said first field effect transistor comprises an N-channel enhancement type MOS field effect transistors connected in common source configuration, and in which said third and fourth transistors are of an NPN conductive type and a PNP conductive type, respectively and being connected in common collector configuration, respectively, and said second field effect transistor comprises a P-channel enhancement type MOS field effect transistor connected in common source configuration.

8. A pulse signal amplifier according to claim 5, further including first and second drive circuits connected between the output of said pulse current signal source and the inputs of said first and second impedance transfer means, respectively, so as to drive the same.

9. A pulse signal amplifier according to claim 8, in which each of said first and second drive circuit comprises a further diode and a further transistor.

10. A pulse signal amplifier according to claim 5, in which said pulse current signal source comprises a pair of transistors each connected in common emitter configuration and ON/OFF controlled in response to a pulse signal supplied to the input electrodes thereof.

* * * * *